United States Patent [19]
Oh

[11] Patent Number: 5,999,460
[45] Date of Patent: Dec. 7, 1999

[54] SEMICONDUCTOR MEMORY DEVICE

[75] Inventor: Hyung Seog Oh, Chungcheongbuk-do, Rep. of Korea

[73] Assignee: LG Semicon Co., Ltd., Chungcheongbuk-do, Rep. of Korea

[21] Appl. No.: 08/825,334

[22] Filed: Mar. 28, 1997

[30] Foreign Application Priority Data

Oct. 24, 1996 [KR] Rep. of Korea ................ 96-48008

[51] Int. Cl.⁶ ................................ G11C 11/34
[52] U.S. Cl. ................ 365/189.09; 365/205; 365/226
[58] Field of Search ........................ 365/189.01, 205, 365/221, 189.09, 226

[56] References Cited

U.S. PATENT DOCUMENTS

| 4,701,884 | 10/1987 | Aoki et al. ................ 365/189 |
| 5,222,064 | 6/1993 | Sagawa . |
| 5,422,842 | 6/1995 | Cernea et al. ................ 365/185 |

FOREIGN PATENT DOCUMENTS 4-20140   2/1992   Japan .

*Primary Examiner*—Viet Q. Nguyen

[57] ABSTRACT

A semiconductor memory device including: an array of memory cells for storing data; a voltage regulator for regulating a variable supply voltage; and a sense amplifier, powered by a regulated voltage from the voltage regulator, for sensing data stored in a specific cell of the array.

17 Claims, 4 Drawing Sheets

SEMICONDUCTOR MEMORY DEVICE

FIELD OF THE INVENTION

The present invention relates to a semiconductor memory device and, more particularly, to a semiconductor memory device capable of constantly maintaining the optimal characteristic of a sense amplifier by controlling power used for a memory device's selection of data with a voltage regulator.

BACKGROUND OF THE INVENTION

In general, a sense amplifier is required to decode a specific cell of a memory cell array. This sense amplifier senses ON ("0" data)/OFF ("1" data) of the selected cell selected by X-decoder (bit line) and Y-decoder (bit line). An output buffer is employed to transmit the output of the sense amplifier to the next terminal.

As illustrated in FIG. 1, a general semiconductor memory device has: an X-decoder part 2 connected to a cell array part 1 and a word line of each cell, for applying the signal; a Y-decoder part 3 connected to the bit line of each cell, for determining if the data stored in the cell is output; a sense amplifier 4 connected to the bit line of each cell, for sensing the data of the selected cell; and an output buffer part 5 connected to the output terminal of the sense amplifier 4. Here, the output buffer 5 is for outputting the data of the cell sensed by the sense amplifier 4.

As illustrated in FIG. 2, a sense amplifier of a conventional semiconductor memory device includes first and second PMOS transistors 21, 22 to which a power supply Vdd and drain are connected; a first NMOS transistor 23 having a drain connected to the source of the second PMOS transistor 22 and a source connected to the bit line; and a second NMOS transistor 24 having a drain connected to the source of the first PMOS transistor 21 and a gate connected to the bit line. Here, the gate of the first NMOS transistor 23 is branch-connected to the source of the first PMOS transistor 21. The gates of the first and second PMOS transistors 21 and 22 are commonly connected to the Vss terminal. The output buffer 5 for outputting the data of the cell sensed by the sense amplifier is formed at the output terminal of the sense amplifier.

The operation of the thus-structured semiconductor memory device is as follows.

As illustrated in FIG. 1, if an address signal for selecting a specific cell is input to the X-decoder part 2 and Y-decoder part 3, the cell corresponding to the address signal is selected. For example, if a random cell C1 of the memory cell array 1 is selected and its data value is "1", C1 is turned off and the potential of the node K1 (which is the input terminal of the sense amplifier 4) is at the high level.

If the node K1 is at the high level, then the second NMOS transistor 24 is turned on. As the second NMOS transistor 24 is turned on, the potential of the node L1 is at the low level. As the potential of the node L1 is at the low level, the first NMOS transistor 23 is turned off. As the second PMOS transistor 22 maintains the turned-on state, the potential of the node B is at the high level.

If the potential of the node K1 is at the low level, then the second NMOS transistor 24 is turned off. As the second NMOS transistor 24 is turned off, the potential of the node L1 is at the high level. Accordingly, the high level signal is applied to the gate of the first NMOS transistor 23 connected to L1 so that the first NMOS transistor 23 is turned on. Here, as the second PMOS transistor 22 is always turned on, the power voltage Vdd is transmitted to the first NMOS transistor 23 through the second PMOS transistor 22 and the potential of the node B is at the low level. Consequently, the data output passing through the output buffer 5 becomes "0".

As illustrated in FIG. 3, in case the supply voltage is 5V, the size of the second PMOS transistor 22 and the first NMOS transistor 23 are controlled to have the optimal characteristics for detecting the data signal. According to the variation of the supply voltage, their size ratio is continuously varied.

The conventional semiconductor memory device has a problem as follows. If the supply voltage is varied, then the characteristic of the sense amplifier which should maintain the optimal characteristic is also varied. Therefore, the conventional memory device cannot be used with a wide range of supply voltages. As a result, the conventional memory device is not satisfactory to the various kinds of user requests for different supply voltages, and can cause an erroneous operation in an apparatus which employs a battery, i.e., an apparatus having variations in supply voltage.

SUMMARY OF THE INVENTION

Accordingly, the present invention is directed to a semiconductor memory device that substantially obviates one or more of the problems due to limitations and disadvantages of the related art.

An object of the present invention is to provide a semiconductor memory device capable of constantly maintaining the optimal characteristic of a sense amplifier by regulating (with a voltage regulator) the voltage used to power a memory device's selection of data.

These and other objects of the present invention are achieved by providing a semiconductor memory device comprising: an array of memory cells for storing data; a voltage regulator for regulating a variable supply voltage; and for outputting a constant power voltage with respect to a variable power voltage, a sense amplifier, powered by a regulated voltage from the voltage regulator, operable to sense data of a specific cell in the array.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and, thus, are not limitative of the present invention, and wherein.

DETAILED DESCRIPTION OF A PREFERRED EMBODIMENT

Reference will now be made in detail to the preferred embodiment s of the present invention, examples of which are illustrated in the accompanying drawings.

Figure 4:
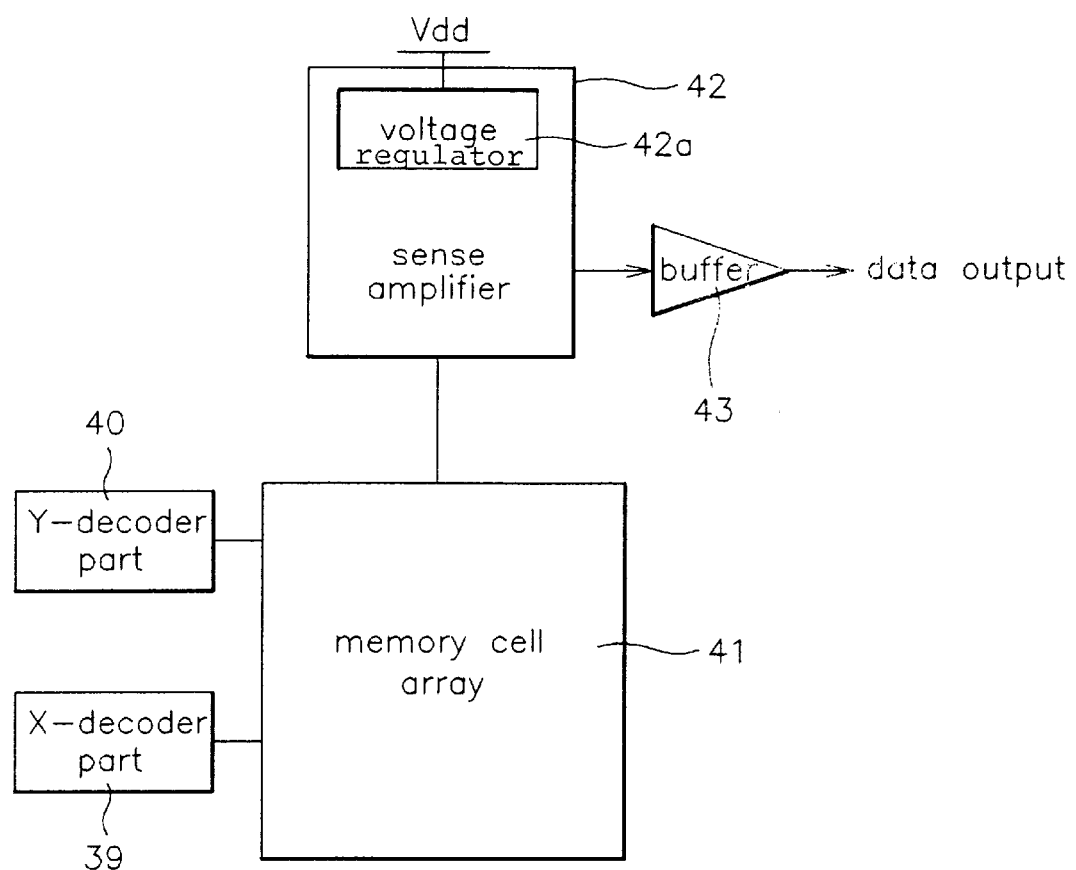
FIG. 4 is a block diagram of a semiconductor memory device embodiment of the invention.

As illustrated in FIG. 4, a semiconductor memory device of the invention includes: an X-decoder part 39; a Y-decoder part 40; a memory cell array 41 for storing data; a sense amplifier 42 for sensing data in the cells of the cell array 41, sense amplifier 42 having a supply voltage regulator 42a for controlling the supply voltage to the sensing circuitry of the sense amplifier 43 to be substantially constant despite variation of the voltage input to the voltage regulator 42a; and an output buffer part 43 for transmitting the output of the sense amplifier 42 as a data output.

Figure 5:
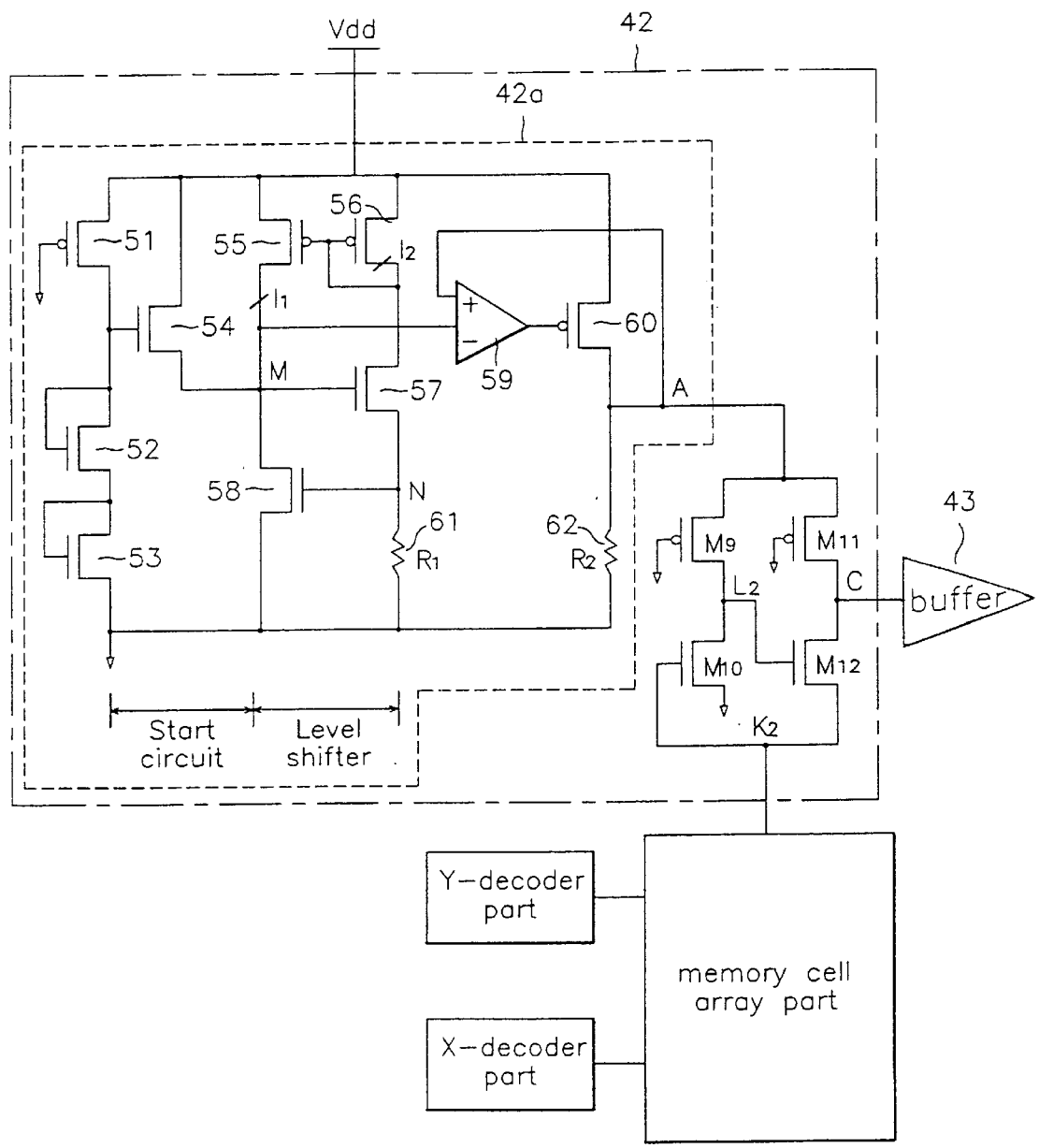
FIG. 5 is a detailed diagram of the sense amplifier of FIG. 4.

As illustrated in FIG. 5, the semiconductor memory device employs the voltage regulator 42a in anticipation that the voltage Vdd otherwise input directly to the sense amplifier 42 would vary. The voltage regulator 42a of the semiconductor memory device of the invention includes: a first PMOS transistor 51 having the drain connected to the supply voltage Vdd, for constantly maintaining the turned-on state; a first NMOS transistor 52 of which its drain and gate are commonly connected to the source of the first PMOS transistor 51; a second NMOS transistor 53 of which its drain and gate are commonly connected to the source of the first NMOS transistor 52 and the source is connected to the ground for the system; a third NMOS transistor 54 having a gate branch-connected between the source of the first PMOS transistor 51 and the drain of the first NMOS transistor 52, and having its drain connected to the voltage Vdd; second and third PMOS transistors 55 and 56 each having its drain connected to the voltage Vdd, and its gate connected with each other; a fourth NMOS transistor 57 having its drain connected to the source of the third PMOS transistor 56, and its gate commonly connected to the source of the third NMOS transistor 54 and the source of the second PMOS transistor 55; a fifth NMOS transistor 58 having its drain connected to the gate of the fourth NMOS transistor 57, and its gate connected to the source of the fourth NMOS transistor 57; a fourth PMOS transistor 60 having its drain connected to the voltage Vdd, and its gate connected to a difference amplifier 59 so that it is turned on/off thereby; the difference amplifier 59 having its input terminal connected to the sources of the second PMOS transistor 55 and the third NMOS transistor 54 and its non-inverting terminal connected to the source of the PMOS transistor 60; a first resistor 61 connecting the source of the fourth NMOS transistor 57, and the gate of the fifth NMOS transistor 58 to ground; and a second resistor 62 connecting the source of the fourth PMOS transistor 60 and the source of the second NMOS transistor 53, i.e., to ground.

The voltage regulator 42a includes a start circuit including the first PMOS transistor 51, and the first through third NMOS transistors 52, 53, and 54; a level shifter including the second and third PMOS transistors 55 and 56 (defining a current mirror), the fourth and fifth NMOS transistors 57 and 58 (feedback-connected to equally maintain the current $I_1$ and $I_2$ flowing through the sources of the second and third PMOS transistors 55 and 56), and the first resistance 61; and a differential amplifier 59 using the reference voltage generated from the start circuit and level shifter.

Figure 1:
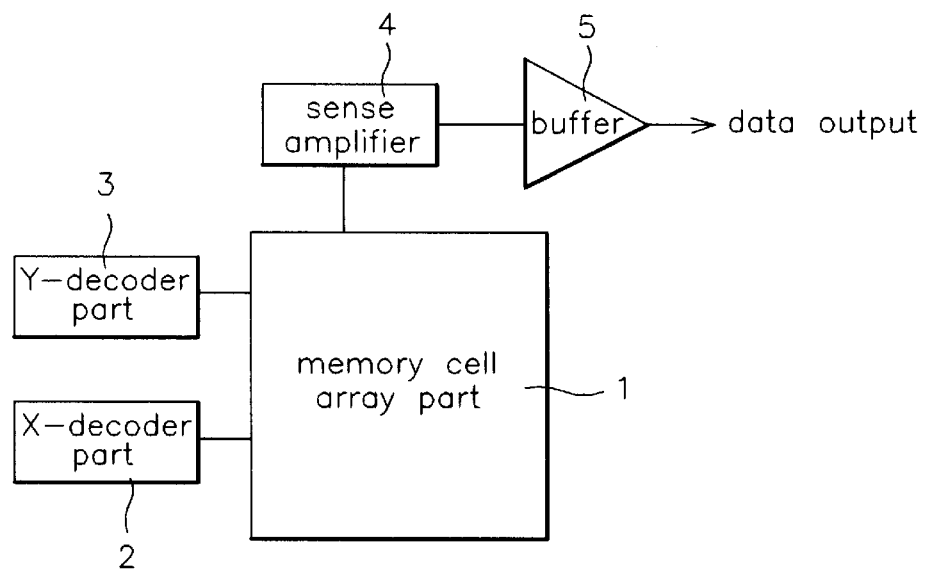
FIG. 1 is a block diagram of a conventional semiconductor memory device.
Figure 2:
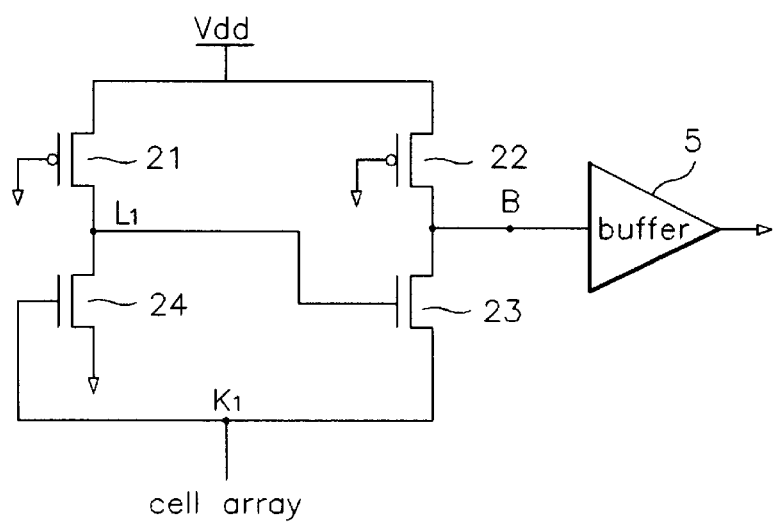
FIG. 2 is circuit of a conventional sense amplifier
Figure 3:
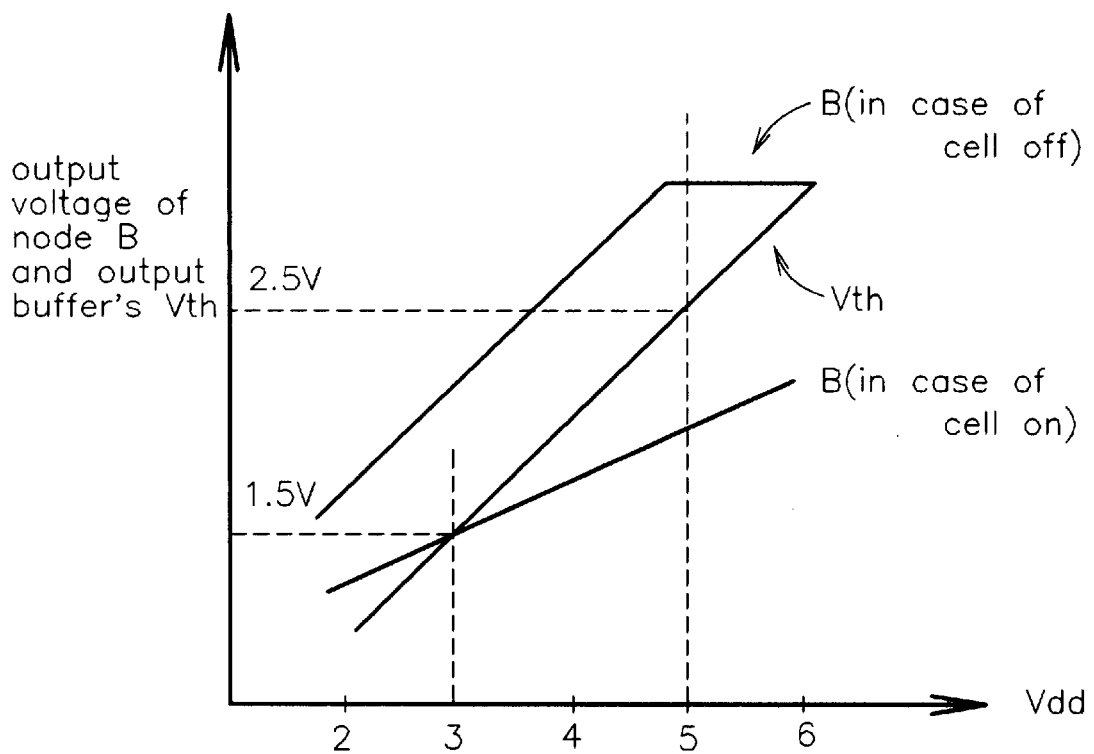
FIG. 3 illustrates the characteristics of a conventional sense amplifier.

As illustrated in FIG. 3, the start circuit is formed to set the level shifter's initial value when the voltage Vdd is initially supplied to the voltage regulator 42. When Vdd increases linearly, the first PMOS transistor 51 constantly maintains the turn-on state. When Vdd voltage exceed two times the threshold voltage (2Vt) of the first PMOS transistor 51, the third NMOS transistor 53 is turned on so that the initial voltage is applied to the point M. The initial voltage at this time is the value of (Vdd-Vt). If the Vdd becomes larger than 2Vt, the third NMOS transistor 53 begins to turn on.

In the level shifter of FIG. 5, the gates of the second and third PMOS transistors 55 and 56 are commonly connected so that the currents $I_1$ and $I_2$ flowing through the respective source are operated as a current mirror. At this time, if the $I_1$ value is larger than the $I_2$ value from a certain factor, the potential of the point M is increased by the fifth NMOS transistor 58. If the potential of the point M is increased, the gate voltage of the fourth NMOS transistor 57 is increased so that the fourth NMOS transistor 57 is drastically turned on.

If the fourth NMOS transistor is drastically turned on, then the current $I_2$ is increased, and accordingly the current incoming to the first resistance $R_1$ (item 61) is also increased so that the voltage of the point N is increased. At last, the potential of the point N is increased, and the fifth NMOS transistor 58 connected to the point N is drastically turned on, so that the potential of the point M is decreased. If so, the gate voltage of the fourth NMOS transistor 57 is decreased. Consequently, according to this feedback, a constant current flows to thereby constantly maintain the potential of the point M. The potential of the point M is used as the reference voltage connected to the inverting terminal of the differential amplifier 59.

The output of the differential amplifier 59 is connected to the gate of the fourth PMOS transistor 60, so that if the output voltage of the differential amplifier is high, the fourth PMOS transistor 60 is slightly turned on to thereby lower the potential of the output terminal A of the voltage regulator. If the potential of the point A is decreased, the value is applied to the (+) input of the differential amplifier 59 to thereby lower the output voltage of the differential amplifier 59. If the output voltage of the differential amplifier 59 is decreased, the gate voltage of the fourth PMOS transistor 60 is decreased, so that the fourth PMOS transistor 60 is powerfully turned on. As a result, if the fourth PMOS transistor 60 is powerfully turned on, the output voltage of the voltage regulator is increased.

According to this feedback, the voltage provided to the sense amplifier is constantly maintained. For example, if the datum of a specific cell of the memory cell array part is "1", the potential of the node K2 becomes a high level. Here, the NMOS transistor M10 is turned on and the potential of the node L2 becomes a low level. As the potential of the node L2 is at a low level, the NMOS transistor M12 is turned off so that the voltage transferred through the PMOS transistor M11 is applied to the node C. Consequently the datum passed through the output buffer is "1". When the datum of the specific cell is "0", the potential at the node K2 is at a low level. As the potential of the node K2 is at a low level, the NMOS transistor M10 is turned off, and the potential of the point L2 is at a high level. Accordingly, the NMOS transistor M12 (of which the gate is connected to the node L2) is turned on and the voltage passing through the PMOS transistor M11 is applied through the NMOS transistor M12, the potential at the node C is at a low level. Consequently, the datum passing through the output buffer is "0".

As described above, the semiconductor memory device has the following effects. First, the sense amplifier's optimal characteristic is constantly maintained by controlling the voltage provided to the sense amplifier to be constant over a wide range of supply voltage Vdd. Second, the erroneous operation due to the variation of Vdd does not occur in the invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
   an array of memory cells for storing data;
   a voltage regulator for regulating a variable supply voltage; and
   a sense amplifier, powered by a regulated voltage from the voltage regulator, for sensing data stored in a specific cell in said array.

2. The device as claimed in claim 1, wherein the voltage regulator includes a start circuit, a level shifter and a differential amplifier.

3. The device as claimed in claim 2, wherein the start circuit sets an initial voltage of the level shifter.

4. The device as claimed in claim 2, wherein a reference voltage generated from the level shifter is provided to the differential amplifier.

5. The device as claimed in claim 1, wherein the voltage regulator comprises:
   first through third PMOS transistors of which respective drains are commonly connected to the variable supply voltage;
   a first NMOS transistor of which the drain and gate are commonly connected to the source of the first PMOS transistor;
   a second NMOS transistor of which the drain and gate are commonly connected to the source of the first NMOS transistor;
   a third NMOS transistor of which the gate is connected to the source of the first PMOS transistor and the drain of the first NMOS transistor, and of which the drain is connected to the variable supply voltage;
   a fourth NMOS transistor of which the drain is connected to the source of the third PMOS transistor, and of which the gate is commonly connected to the source of the third NMOS transistor and the source of the second PMOS transistor;
   a fifth NMOS transistor of which the drain is connected to the source of the second PMOS transistor, and of which the gate is connected to the source of the fourth NMOS transistor;
   a differential amplifier for receiving voltage on the source of the second PMOS transistor as a reference voltage, and for amplifying a difference between an input voltage and the reference voltage;
   a fourth PMOS transistor of which the gate is connected to an output terminal of the differential amplifier, and of which the drain is connected to the variable supply voltage, an operational state of the fourth PMOS transistor being determined according to the output voltage of the differential amplifier;
   a first resistor connecting the source of the fourth NMOS transistor to the source of the second NMOS transistor; and
   a second resistor connecting the source of the fourth PMOS transistor to the source of the second NMOS transistor.

6. The device as claimed in claim 5, wherein the source of the second NMOS transistor is connected to a system ground.

7. The device as claimed in claim 5, wherein the gates of the second and third PMOS transistors are connected together such that the second and third PMOS transistors are operable together as a current mirror.

8. A semiconductor memory device comprising:
   an array of memory cells for storing data;
   a voltage regulator for regulating a variable supply voltage; and
   a sense amplifier, powered by a regulated voltage from the voltage regulator, for sensing data stored in a specific cell in said array;
   wherein said voltage regulator includes a first feedback circuit for adaptively adjusting said regulated voltage, and a second feedback circuit for stabilizing an input to said first feedback circuit, said input corresponding to said variable supply voltage.

9. The device as claimed in claim 8, further comprising:
   an output buffer connected to the output terminal of the sense amplifier, and for outputting a value sensed by the sense amplifier.

10. The device as claimed in claim 9, wherein the second feedback circuit includes a start circuit and a level shifter and said first feedback circuit includes a differential amplifier.

11. The device as claimed in claim 10, wherein the start circuit sets an initial voltage of the level shifter.

12. The device as claimed in claim 10, wherein a reference voltage generated from the level shifter is provided to the differential amplifier.

13. The device as claimed in claim 8, wherein the voltage regulator comprises:
   first through third PMOS transistors of which respective drains are commonly connected to the variable supply voltage;
   a first NMOS transistor of which the drain and gate are commonly connected to the source of the first PMOS transistor;
   a second NMOS transistor of which the drain and gate are commonly connected to the source of the first NMOS transistor;
   a third NMOS transistor of which the gate is connected to the source of the first PMOS transistor and the drain of the first NMOS transistor, and of which the drain is connected to the variable supply voltage; and
   a first resistor connecting the source of the fourth NMOS transistor to the source of the second NMOS transistor;
   wherein the first feedback circuit includes:
      a fourth NMOS transistor of which the drain is connected to the source of the third PMOS transistor, and of which the gate is commonly connected to the source of the third NMOS transistor and the source of the second PMOS transistor; and
      a fifth NMOS transistor of which the drain is connected to the source of the second PMOS transistor, and of which the gate is connected to the source of the fourth NMOS transistor a first resistor connecting the source of the fourth NMOS transistor to the source of the second NMOS transistor; and
   wherein the second feedback circuit includes:
      a differential amplifier for receiving voltage on the source of the second PMOS transistor as a reference voltage, and for amplifying a difference between an input voltage and the reference voltage;

a fourth PMOS transistor of which the gate is connected to an output terminal of the differential amplifier, and of which the drain is connected to the variable supply voltage, an operational state of the fourth PMOS transistor being determined according to the output voltage of the differential amplifier; and a second resistor connecting the source of the fourth PMOS transistor to the source of the second NMOS transistor.

14. The device as claimed in claim 13, wherein the source of the second NMOS transistor is connected to a system ground.

15. The device as claimed in claim 13, wherein the gates of the second and third PMOS transistors are connected together such that the second and third PMOS transistors are operable together as a current mirror.

16. The device as claimed in claim 1, further comprising an output buffer, connected to an output terminal of the sense amplifier, for outputting a value sensed by the sense amplifier.

17. The devices as claimed in claim 1, wherein said regulated voltage is fed back to said voltage regulator such that said voltage regulator uses closed loop regulation to produce said regulated voltage.

* * * * *